(12) United States Patent
Bhattacharyya et al.

(10) Patent No.: US 7,457,159 B2
(45) Date of Patent: Nov. 25, 2008

(54) INTEGRATED DRAM-NVRAM MULTI-LEVEL MEMORY

(75) Inventors: Arup Bhattacharyya, Essex Junction, VT (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 327 days.

(21) Appl. No.: 11/368,248

(22) Filed: Mar. 3, 2006

(65) Prior Publication Data

US 2006/0152963 A1    Jul. 13, 2006

Related U.S. Application Data

(62) Division of application No. 10/928,250, filed on Aug. 27, 2004, now Pat. No. 7,158,410.

(51) Int. Cl.
*G11C 11/34* (2006.01)
(52) U.S. Cl. .............. 365/185.08; 365/185.05; 365/185.26; 365/185.03; 257/314; 257/316
(58) Field of Classification Search ............ 365/185.08, 365/185.05, 185.26, 185.03
See application file for complete search history.

(56) References Cited

U.S. PATENT DOCUMENTS

| | | | |
|---|---|---|---|
| 4,448,400 A * | 5/1984 | Harari | 365/185.03 |
| 4,870,470 A | 9/1989 | Bass | |
| 5,057,448 A | 10/1991 | Kuroda | |
| 5,140,552 A | 8/1992 | Yamauchi et al. | |
| 5,196,722 A * | 3/1993 | Bergendahl et al. | 257/304 |
| 5,399,516 A * | 3/1995 | Bergendahl et al. | 438/589 |
| 5,598,367 A | 1/1997 | Noble | |

(Continued)

FOREIGN PATENT DOCUMENTS

EP    1 383 134 A1 *  1/2004

(Continued)

OTHER PUBLICATIONS

S. Okhonin, et al "A SOI Capacitor-less 1T-DRAM Concept", 2001 IEEE International SOI Conference, Oct. 2001, pp. 153-154.*

(Continued)

*Primary Examiner*—Viet Q Nguyen
(74) *Attorney, Agent, or Firm*—Leffert Jay & Polglaze, P.A.

(57) ABSTRACT

An integrated DRAM-NVRAM, multi-level memory cell is comprised of a vertical DRAM device with a shared vertical gate floating plate device. The floating plate device provides enhanced charge storage for the DRAM part of the cell through the shared floating body in a pillar between the two functions. The memory cell is formed in a substrate with trenches that form pillars. A vertical wordline/gate on one side of a pillar is used to control the DRAM part of the cell. A vertical trapping layer on the other side of the pillar stores one or more charges as part of the floating plate device and to enhance the DRAM function through the floating body between the DRAM and floating plate device. A vertical NVRAM wordline/control gate is formed alongside the trapping layer and is shared with an adjacent floating plate device.

18 Claims, 3 Drawing Sheets

U.S. PATENT DOCUMENTS

| | | | |
|---|---|---|---|
| 5,623,442 | A | 4/1997 | Gotou et al. |
| 5,880,991 | A | 3/1999 | Hsu et al. |
| 5,932,908 | A | 8/1999 | Noble |
| 5,973,344 | A | 10/1999 | Ma |
| 6,141,248 | A | 10/2000 | Forbes |
| 6,166,407 | A | 12/2000 | Ohta |
| 6,185,712 | B1 | 2/2001 | Kirihata et al. |
| 6,232,643 | B1 | 5/2001 | Forbes |
| 6,246,606 | B1 | 6/2001 | Forbes |
| 6,266,272 | B1 | 7/2001 | Kirihata |
| 6,282,118 | B1 | 8/2001 | Lung |
| 6,297,989 | B1 | 10/2001 | Cloud |
| 6,391,755 | B2 | 5/2002 | Ma |
| 6,424,011 | B1 | 7/2002 | Assaderaghi et al. |
| 6,452,856 | B1 | 9/2002 | Forbes |
| 6,498,739 | B2 | 12/2002 | Cloud et al. |
| 6,503,794 | B1 | 1/2003 | Watanabe et al. |
| 6,531,731 | B2 | 3/2003 | Jones, Jr. et al. |
| 6,541,815 | B1 * | 4/2003 | Mandelman et al. ........ 257/315 |
| 6,617,651 | B2 | 9/2003 | Ohsawa |
| 6,661,042 | B2 | 12/2003 | Hsu |
| 6,717,205 | B2 | 4/2004 | Gratz |
| 6,741,519 | B2 | 5/2004 | Forbes |
| 6,743,681 | B2 | 6/2004 | Bhattacharyya |
| 6,771,538 | B2 | 8/2004 | Shukuri |
| 6,784,480 | B2 | 8/2004 | Bhattacharyya |
| 6,785,167 | B2 | 8/2004 | Kurth |
| 6,790,727 | B2 | 9/2004 | Jones, Jr. et al. |
| 6,791,877 | B2 | 9/2004 | Miura |
| 6,798,008 | B2 | 9/2004 | Choi |
| 6,801,994 | B2 | 10/2004 | Beckert et al. |
| 6,878,991 | B1 * | 4/2005 | Forbes ........................ 257/328 |
| 6,979,857 | B2 * | 12/2005 | Forbes ........................ 257/314 |
| 7,148,538 | B2 * | 12/2006 | Forbes ........................ 257/316 |
| 7,157,771 | B2 * | 1/2007 | Forbes ........................ 257/330 |
| 7,158,410 | B2 * | 1/2007 | Bhattacharyya et al. ........................ 365/185.08 |
| 7,190,616 | B2 * | 3/2007 | Forbes et al. ............ 365/185.05 |
| 7,241,654 | B2 * | 7/2007 | Forbes ........................ 438/209 |
| 7,273,784 | B2 * | 9/2007 | Bhattacharyya ............. 438/259 |
| 2004/0041208 | A1 | 3/2004 | Bhattacharyya |
| 2004/0042256 | A1 | 3/2004 | Forbes |

FOREIGN PATENT DOCUMENTS

| | | | |
|---|---|---|---|
| JP | 402240960 A | * | 9/1990 |
| JP | 410289980 A | * | 10/1998 |

OTHER PUBLICATIONS

P. Fazan, et al "Capacitor-Less 1-Transistor DRAM", 2002 IEEE International SOI Conference, Oct. 2002, pp. 10-13.*

P. Fazan, et al "A Simple Transistor Capacitor-Less Memory Cell for High Performance Embedded DRAMs", IEEE 2002 Custom Integrated Circuits Conference, pp. 99-102.*

T. Ohsawa, et al. "Memory Design Using One-Transistor Gain Cell on SOI", IEEE International Solid State Circuit Conference, 2002, pp. 152-153, 454.*

T. Ohsawa, et al. "A Memory Using One-Transistor Gain Cell on SOI (FBC) with Performance Suitable for Embedded DRAMS", 2003 Symposium on VLSI Circuits, Digest of Technical Papers, Jun. 12-14, 2003, pp. 93-96.*

T. Ohsawa, et al. "Memory Design Using a One-Transistor Gain Cell on SOI", IEEE Journal of Solid-State Circuits, vol. 37, No. 11, Nov. 2002, pp. 1510-1522.*

A. Battacharyya, et al. "Physical and Electrical Characteristics of LPCVD Silicon Rich Nitride", ECS Tech Digest, New Orleans, Louisiana, vol. 84-2, Oct. 11, 1984, pp. 1-19.*

* cited by examiner

US 7,457,159 B2

INTEGRATED DRAM-NVRAM MULTI-LEVEL MEMORY

RELATED APPLICATION

This Application is a Divisional of U.S. application Ser. No. 10/928,250, titled "INTEGRATED DRAM-NVRAM MULTI-LEVEL MEMORY," filed Aug. 27, 2004, now U.S. Pat. No. 7,158,410 which is commonly assigned and incorporated herein by reference.

TECHNICAL FIELD OF THE INVENTION

The present invention relates generally to memory devices and in particular the present invention relates to DRAM and NVRAM architectures.

BACKGROUND OF THE INVENTION

Memory devices are typically provided as internal, semiconductor, integrated circuits in computers or other electronic devices. There are many different types of memory including random-access memory (RAM), read only memory (ROM), flash memory, dynamic random access memory (DRAM), and synchronous dynamic random access memory (SDRAM).

Conventional DRAM cells are comprised of a switching transistor and an integrated storage capacitor tied to the storage node of the transistor. Charge storage is enhanced by providing appropriate storage capacity in the form of a stacked capacitor or a trench capacitor in parallel with the depletion capacitance of the floating storage node. DRAM cells are volatile and therefore lose data when the power is removed.

DRAMs use one or more arrays of memory cells arranged in rows and columns. Each of the rows of memory cells is activated by a corresponding row line that is selected from a row address. A pair of complementary digit lines are provided for each column of the array and a sense amplifier coupled to the digit lines for each column is enabled responsive to a respective column address. The sense amplifier senses a small voltage differential between the digit lines and amplifies such voltage differential.

Due to finite charge leakage across the depletion layer, the capacitor has to be recharged frequently to ensure data integrity. This is referred to in the art as refreshing and can be accomplished by periodically coupling the memory cells in the row to one of the digit lines after enabling the sense amplifiers. The sense amplifiers then restore the voltage level on the memory cell capacitor to a voltage level corresponding to the stored data bit. The permissible time between refresh cycles without losing data depends on various factors such as rate of charge dissipation in the memory capacitor.

As computers become smaller and their performance increases, the computer components should also go through a corresponding size reduction and performance increase. To accomplish this, the capacitors and transistors of DRAM cells can be reduced in size. This has the effect of increased speed and memory density with decreased power requirements.

However, a problem with decreased capacitor size is that sensing a conventional DRAM cell requires a minimum value of capacitance per cell. As the capacitor gets smaller, the capacitance is reduced. This has become a scalability challenge for DRAM.

For the reasons stated above, and for other reasons stated below which will become apparent to those skilled in the art upon reading and understanding the present specification, there is a need in the art for a more scalable DRAM cell.

SUMMARY

The above-mentioned problems with DRAMs and other problems are addressed by the present invention and will be understood by reading and studying the following specification.

The present invention encompasses an integrated DRAM-NVRAM memory cell. The cell comprises a dynamic random access memory function and a non-volatile random access memory function that is coupled to the dynamic random access memory function. The data storage by the dynamic random access memory function is enhanced by the non-volatile random access memory device that provides a non-volatile state retention in the DRAM. The non-volatile random access memory can store multiple bits of data.

Further embodiments of the invention include methods and apparatus of varying scope.

DETAILED DESCRIPTION

Figure 1:
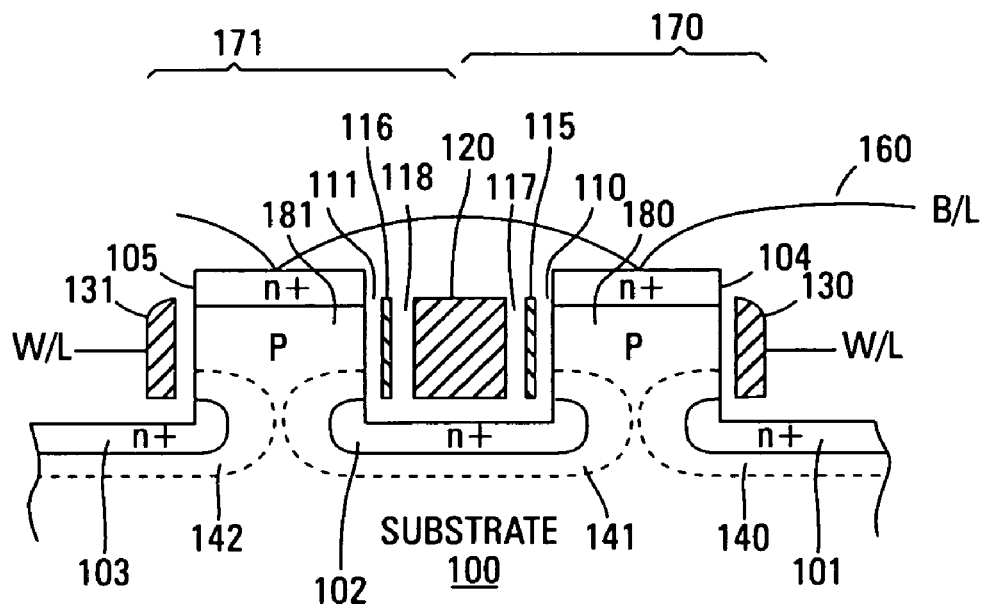
FIG. 1 shows a cross-sectional view of one embodiment of a DRAM-NVRAM multi-level memory cell of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

FIG. 1 illustrates a cross-sectional view of one embodiment of DRAM-NVRAM multi-level memory cells of the present invention. The cells are fabricated in trenches in a bulk silicon substrate 100. Pillars are formed between the trenches. In one embodiment, the substrate is comprised of p-type silicon. In alternate embodiments, the substrate is comprised of n-type material.

For purposes of clarity, FIG. 1 illustrates only two of the DRAM-NVRAM memory cells 170 and 171 that comprise an array of memory cells. It is well known in the art that a typical memory array could have millions of cells.

Each DRAM-NVRAM cell 170 and 171 is comprised of a DRAM transistor and a NVRAM transistor. Each DRAM transistor is comprised of a drain region 104 and 105 and a source region 101 and 103. These regions 101, 103-105, in one embodiment, are doped n+ regions in the trenches and pillars of the substrate 100.

Vertical gates 130 and 131 are formed along the sidewalls of the trenches such that they are substantially between each transistor's active regions 101 and 104 or 103 and 105 with respective floating bodies 180 and 181. The vertical gates 130 and 131 are separated from the pillars by a dielectric material. The gates 130 and 131 are coupled to wordlines of the memory array.

Each NVRAM transistor is comprised of a drain region 104 and 105 that is formed in the tops of the pillars and shared with its respective DRAM transistor. A source region 102 is formed at the bottom of the trench and is shared between the two NVRAM transistors.

A vertical channel region exists between each pair of source/drain regions 101, 104 or 103, 105 for the gated transistors or 102, 104 or 102, 105 for the NV transistors gated by the shared control gate 120. For example, during operation, a channel forms in the floating body channel region between one drain 104, 101 or 105, 103.

Each NVRAM transistor is comprised of a floating plate 115 and 116 in which one or more charges are trapped and stored. The floating plates 115 and 116 are isolated from the channel regions by tunneling dielectrics 110 and 111 and from the shared control gate 120 by a charge blocking layer (i.e., intergate dielectric) 117 and 118 that prevents a trapped charge from leaking to the control gate. Each tunneling dielectric/floating plate/charge blocking layer makes up an insulator stack for each NVRAM transistor and, in one embodiment, is approximately 15 nm thick. The materials of construction are not critical to the present invention, but commonly include doped polysilicon for the gate/plate materials, and silicon oxides, nitrides or oxynitrides for the dielectric materials.

A data/bitline 160 couples each of the drain regions 104 and 105 in the tops of the pillars. Additionally, the source regions 101-103 are coupled to a source line of the memory array. As is shown later with reference to FIG. 2, the source lines 101-103 of the cells 170 and 171 may be coupled to ground potential with the substrate (p-type silicon) held at a negative potential such that the source lines and associated junctions are constantly held reverse biased.

During operation of the transistors of the present invention, depletion regions 140-142 form around each of the source regions 101-103 respectively. The touching of the depletion regions 140 and 141 or 141 and 142 isolates the active p-type pillar body above the depletion regions, thus creating a p-type floating body in each pillar.

Figure 2:
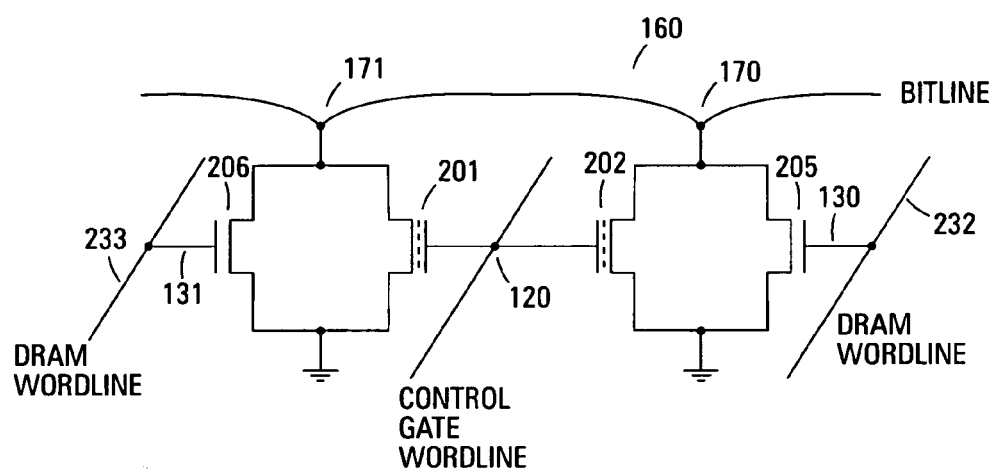
FIG. 2 shows an electrical equivalent circuit diagram of the embodiment of FIG. 1.

FIG. 2 illustrates an electrical equivalent circuit diagram of the embodiment of FIG. 1. This figure shows the two DRAM-NVRAM cells 170 and 171 of FIG. 1.

Each cell 170 and 171 is comprised of an NVRAM transistor 202 and 201 that shares a common control gate/wordline 120 that couples a row of cells in the memory array. Each cell 170 and 171 also has a field effect transistor (FET) 205 and 206. The gate 130 and 131 of each FET 205 and 206 is coupled to a respective DRAM wordline 232 and 233. The DRAM wordlines 232 and 233 couple the FETs in a common row of cells of the array. The memory array bitline 170 couples the drains of each transistor in a common column of cells.

Figure 3:
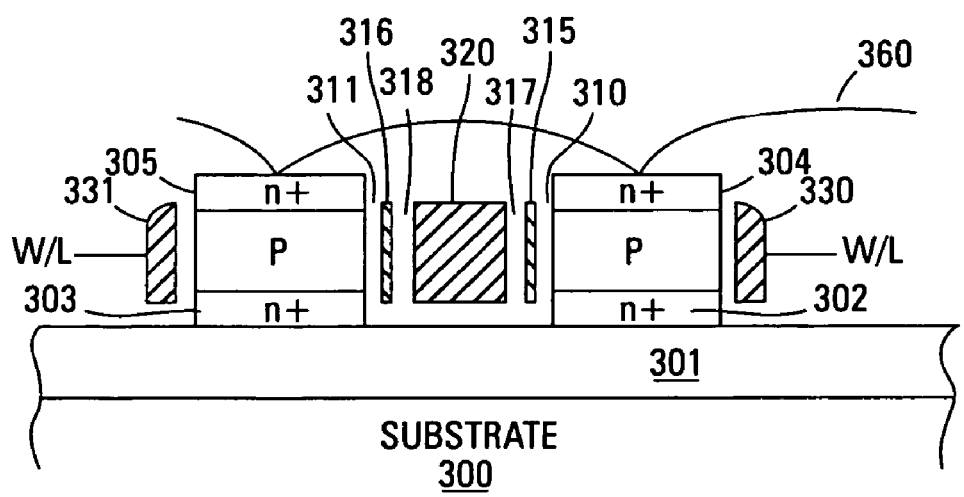
FIG. 3 shows a cross-sectional view of an alternate embodiment of the DRAM-NVRAM multi-level memory cell of the present invention.

FIG. 3 illustrates a cross-sectional view of an alternate embodiment of the DRAM-NVRAM multi-level cell of the present invention. This embodiment uses a silicon-on-insulator (SOI) structure. SOI refers to placing a thin layer of silicon on an insulator such as silicon oxide or glass. The transistors would then be built on this thin layer of SOI. The SOI layer reduces the capacitance of the transistors so that they operate faster. The embodiment of FIG. 3 shares the electrical equivalent schematic of FIG. 2.

As in the embodiment of FIG. 1, each cell is comprised of a DRAM transistor and a NVRAM transistor. The DRAM transistors are comprised of pillars that have drain 304 and 305 regions at the top. The source regions 302 and 303 are formed at the bottom of the pillars. The DRAM vertical gates 330 and 331 are formed over the channel regions and are coupled to their respective wordlines.

Each NVRAM transistor uses the same drain 304 and 305 and source regions 302 and 303 as their respective DRAM transistors. Each insulator stack is comprised of a tunnel dielectric 310 and 311, floating plate 315 and 316, and charge blocking oxide 317 and 318. The common control gate 320 is formed in the center of the trench and is coupled to the array NVRAM wordline.

The above structure is formed on the insulator layer 301 that is formed over the substrate 300. In one embodiment, the insulator layer 301 is an oxide and the substrate and the floating body are a p-type silicon.

In operation, the DRAM-NVRAM cell of the present invention provides multi-functionality as well as multi-level NVRAM storage. When the NVRAM control gate is grounded, the cell works like a DRAM. Even though the DRAM transistor of the present invention is a capacitor-less DRAM cell, it operates in the same manner as a DRAM cell except with an improved retention state compared to typical prior art DRAM cells.

When the DRAM device is in a high conductance state (i.e., a logic 0 is written), some of the excess hole charge in the floating body tunnels through the trapping layer and gets trapped. Consequently the device conductance is further increased, thus creating a "fat 0" where the DRAM device has an increased hole charge in comparison to typical prior art DRAM cells.

Conversely, when electrons are generated in the floating body to create the lower conductance state (i.e., a logic 1 is written), some of the excess electrons get trapped into the trapping layer with the resulting effect of still lower conductance. Hence, a "fat 1" is created. A transistor that stores a "fat 1" has an elevated threshold voltage and, therefore, less leakage current than a typical prior art device. Thus the effect of the trapping layer of the DRAM transistor of the present invention is to improve the logic separation and associated signal margin of the DRAM state and/or state retention.

For NVRAM operation, the NVRAM control gate is pulsed to a negative potential concurrent to pulling up both the bitline and the NVRAM wordline to $V_{dd}$. This drives the access device to saturation. A strong lateral field generated between the floating body and the control gate drives excess holes, generated in the body, to tunnel through the tunnel oxide and to be trapped. Due to this hole trapping, the adjacent body potential is raised to a positive potential where it is held permanently until the trapped state is discharged by trapping electrons. This is a non-volatile "zero" state. It can be sensed readily (i.e., a read 0) by turning the access device wordline up and sensing the current through the bitline.

To write a non-volatile "one" state, the control gate is pulsed positive concurrent to forward bias either the drain-body diode or the source-body diode. This injects excess electrons into the floating body. The trapping layer traps the excess electrons that cause a permanent negative potential. As a result, the access device $V_t$ is raised and the device does not conduct during a logical one read operation. The device remains in the non-volatile logical 1 state until the trapping layer electrons are neutralized by injecting holes during an erase operation.

For multi-level NVRAM operation, the above-described logical 0 and 1 states can be addressed or read either by the wordline of the access device (corresponding to a $V_{t\text{-}WL}$ of a logic "0" and a $V_{t\text{-}WL}$ of a logic "1" respectively) or by the control gate device (corresponding to a $V_{t\text{-}CG}$ of a logic "0" and a $V_{t\text{-}CG}$ of a logic "1" respectively). For the same degree of charge storage in the trapping layer, the control gate $V_t$'s would be significantly different than those of the access device $V_t$'s and, therefore, bi-level addressing could be achieved and the device achieves virtual dual-bit storage for the same written state.

Additional multi-level non-volatile storage could be achieved by directly storing increasing density of charges (i.e., electrons or holes) into the trapping layer by appropriate programming of the control gate conventionally with increasing programming voltages (positive or negative). This generates multiple high $V_t$ states (i.e., multiple $V_{t\text{-}CG}$ logical ones). Addressing is performed using both the DRAM wordline and NVRAM control gate and establishing appropriate sensing schemes to separate all levels of storage states.

The DRAM-NVRAM cell of the present invention can also be converted into a PROM for use in a field programmable gate array (FPGA), an alterable switch, or a BIOS-storing application. The cell can be converted into a PROM by appropriate electron charge density or hole charge density stored into the trapping layer by programming via the NVRAM control gate.

The floating plate NVRAM transistor of the present invention requires a significantly lower field across the dielectric stack for programming via the control gate. This results in an increased endurance capability (e.g., $>10 \times 10^{10}$ cycles) and scalability both in geometry and voltages. With appropriate selection and scaling of the gate insulator stack (i.e., tunnel insulator, trapping layer, charge blocking layer), the average programming field can be reduced to between $3 \times 10^6$ and $6 \times 10^6$ V/cm compared to a typical average field of $12 \times 10^6$ V/cm for a floating gate device.

The following table illustrates one embodiment of operational voltages for a gate insulator stack comprising a 4.5 nm tunnel insulator, a 6 nm Silicon-Silicon rich-Nitride trapping dielectric, and a 6.5 nm $SiO_2$ charge blocking layer that requires a programming voltage below 9 V. This table is for purposes of illustration only as different embodiments of the present invention can use different operational voltages to enable the read or write operational modes.

| OPERATION | $V_{BL}$ | $V_{WL}$ | $V_{SL}$ | $V_{CG}$ | $V_{sub}$ |
|---|---|---|---|---|---|
| DRAM write "0" | 2.5 | 2.5 | Gnd | Gnd | −2.5 |
| DRAM write "1" | Gnd | 0.8 | −2.5 | Gnd | −2.5 |
| DRAM read "0" | Float | 0.8 | Gnd | Gnd | −2.5 |
| DRAM read "1" | Float | 0.8 | Gnd | Gnd | −2.5 |
| NVRAM write "0" | 2.5 | 2.5 | Gnd | −2.5/−9 | −2.5 |

-continued

| OPERATION | $V_{BL}$ | $V_{WL}$ | $V_{SL}$ | $V_{CG}$ | $V_{sub}$ |
|---|---|---|---|---|---|
| NVRAM write "1" | Gnd | 0.8 | −2.5 | 2.5/9 | −2.5 |
| NVRAM read "A0" | Float | 0.8 | Gnd | Gnd | −2.5 |
| NVRAM read "A1" | Float | 0.8 | Gnd | Gnd | −2.5 |
| NVRAM read "B0" | Float | 0.0 | Gnd | 1.2 | −2.5 |
| NVRAM read "B1" | Float | 0.0 | Gnd | 1.2 | −2.5 |

In this table, $V_{BL}$ is the bitline voltage, $V_{WL}$ is the DRAM wordline voltage, $V_{SL}$ is the DRAM source line or region voltage, $V_{CG}$ is the NVRAM control gate/wordline voltage, and $V_{sub}$ is the negative substrate bias. The "Ax" and "Bx" of the above table describes the two states of a single bit (i.e., bit A or bit B). In the case of the NVRAM reading of "A1" and "B1", the bitline potentials are unchanged.

The above-described logic separation between "Ax" and "Bx" could be used for multi-level storage. The programming voltage, $V_{x\text{-}CG}$, could be altered to $V_{y\text{-}CG}$ to create a different logic level separation "Ax" and "Bx" for multi-level storage. Substantially similar approaches can be used for PROM writing of "1" and "0".

Figure 4:
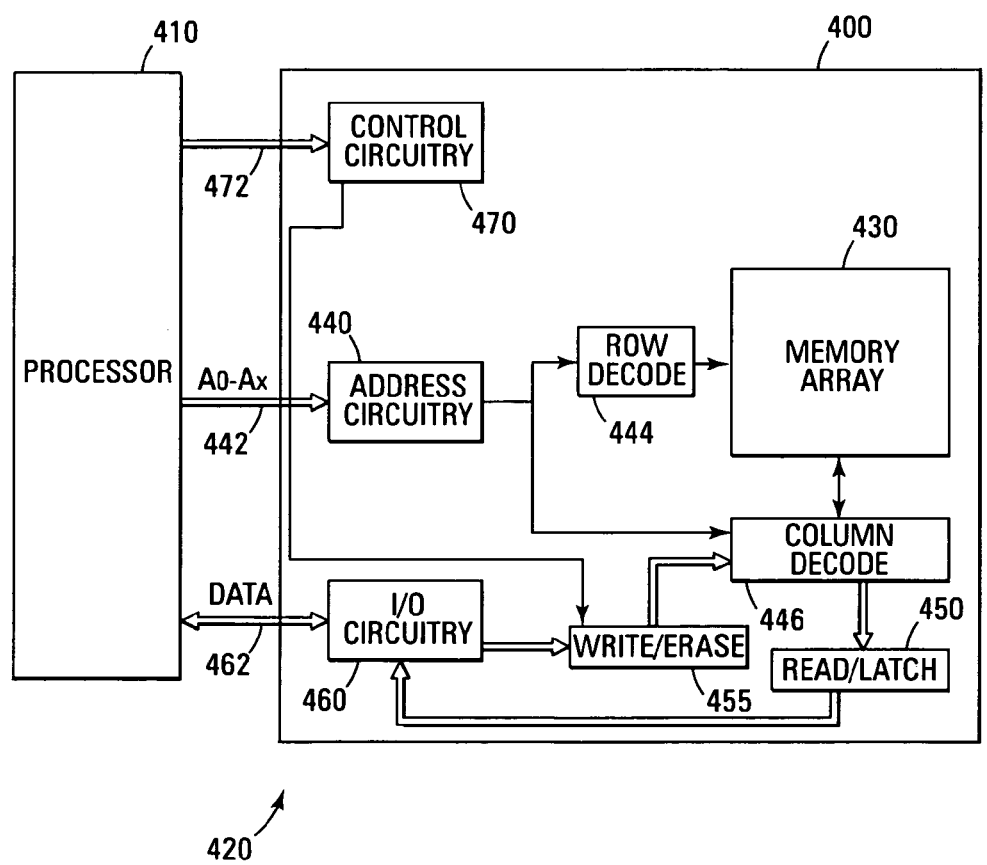
FIG. 4 shows a block diagram of an electronic system that incorporates the non-planar, stepped NROM array of the present invention.

FIG. 4 illustrates a functional block diagram of a memory device 400 that can incorporate the DRAM-NVRAM memory cells of the present invention. The memory device 400 is coupled to a processor 410. The processor 410 may be a microprocessor or some other type of controlling circuitry. The memory device 400 and the processor 410 form part of an electronic system 420. The memory device 400 has been simplified to focus on features of the memory that are helpful in understanding the present invention.

The memory device includes an array of memory cells 430 that can be comprised of the multi-level DRAM-NVRAM cells previously illustrated. The memory array 430 is arranged in banks of rows and columns. The gates of each row of memory cells is coupled with a wordline while the drain and source connections of the memory cells are coupled to bitlines.

An address buffer circuit 440 is provided to latch address signals provided on address input connections A0-Ax 442. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense/buffer circuitry 450. The sense/buffer circuitry, in one embodiment, is coupled to read and latch a row of data from the memory array 430. Data input and output buffer circuitry 460 is included for bi-directional data communication over a plurality of data connections 462 with the controller 410. Write circuitry 455 is provided to write data to the memory array.

Control circuitry 470 decodes signals provided on control connections 472 from the processor 410. These signals are used to control the operations on the memory array 430, including data read, data write (program), and erase operations. The control circuitry 470 may be a state machine, a sequencer, or some other type of controller.

The memory device illustrated in FIG. 4 has been simplified to facilitate a basic understanding of the features of the memory. A more detailed understanding of internal circuitry and functions of memories are known to those skilled in the art.

CONCLUSION

In summary, the embodiments of the integrated DRAM-NVRAM memory of the present invention provide the functions of DRAM storage that does not require stack or trench capacitors for data storage as well as non-volatile memory storage in a memory cell. The NVRAM transistor is capable of multi-level storage in order to increase memory density without additional transistors.

The DRAM-NVRAM cell functionally integrates DRAM and non-volatile memory while overcoming the limitations of both. For example, the DRAM function can use the trapping layer of the NVRAM transistor to enhance charge storage so that a refresh cycle is not required. Similarly, the NVRAM function uses a floating plate for charge storage that is more scalable than a typical floating gate device.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An integrated DRAM-NVRAM memory cell comprising:
   a field effect transistor having a floating body portion; and
   a floating plate transistor coupled to the field effect transistor through the floating body portion wherein the floating plate is configured to either accept excess hole charge from the floating body to increase field effect transistor conductance or accept excess electrons from the floating body to decrease field effect transistor conductance.

2. The memory cell of claim 1 and further including:
   the field effect transistor having a drain region and a first source region located on opposite sides of the floating body; and
   the floating plate transistor having a second source region and sharing the drain region with the field effect transistor, the first and second source regions each adapted to generate a depletion region that are substantially close enough together to create the floating body portion.

3. The memory cell of claim 1 wherein the field effect transistor and the floating plate transistor are vertical transistors that are fabricated in trenches and pillars formed into a substrate material.

4. The memory cell of claim 1 wherein the floating body portion stores data for a DRAM function of the cell.

5. The memory cell of claim 4 wherein the floating plate transistor enables the field effect transistor to store data without refresh.

6. The memory cell of claim 1 wherein the floating plate transistor is a multi-level device adapted to store a plurality of data bits.

7. The memory cell of claim 6 wherein the plurality of data bits are addressed by a first voltage level of a set of read voltage levels applied to the memory cell.

8. The memory cell of claim 1 wherein the floating plate transistor enhances the data storage by the field effect transistor by providing non-volatile state retention.

9. An integrated DRAM-NVRAM memory cell formed in a substrate, the memory cell comprising:
   a field effect transistor having a floating body portion with a drain region and a first source region located on opposite sides of the floating body; and
   a floating plate transistor coupled, though the floating body portion, to the field effect transistor and sharing the drain region with the field effect transistor, the floating plate transistor comprising:
     a second source region, the first and second source regions each adapted to generate a depletion region that are substantially close enough together to create the floating body portion; and
     a tunneling dielectric formed between the floating plate and the substrate.

10. The memory cell of claim 9 wherein the doped drain regions are n+ regions and the substrate is a p-type conductivity.

11. The memory cell of claim 9 wherein, during operation of the memory cell, the source regions at the bottom of the first and the second trenches are adapted to generate depletion regions that substantially meet to form a floating body in the first pillar.

12. The memory cell of claim 9 and further including a vertical control gate formed adjacent to the floating plate.

13. The memory cell of claim 12 and further including a tunnel dielectric layer and a charge blocking layer formed on either side of the floating plate.

14. The memory cell of claim 13 wherein the tunnel dielectric layer and the charge blocking layer are comprised of silicon dioxide.

15. An integrated DRAM-NVRAM memory cell formed in a substrate having a pillar defined by two trenches, the memory cell comprising:
   a field effect transistor having a floating body portion with a drain region in the pillar and a first source region formed under a first trench; and
   a floating plate transistor coupled, through the floating body portion, to the field effect transistor and sharing the drain region with the field effect transistor, the floating plate transistor comprising:
     a vertical floating plate formed adjacent to a vertical side of the pillar;
     a control gate formed in the remaining trench and adjacent to the vertical floating plate;
     a second source region formed under the remaining trench;
     a tunneling dielectric formed between the floating plate and the pillar; and
     a charge blocking layer formed between the control gate and the floating plate.

16. The memory cell of claim 15 wherein the field effect transistor comprises a vertical gate formed along an opposing side of the pillar from the vertical floating plate.

17. The memory cell of claim 15 wherein the first and second source regions are each adapted to generate a depletion region that are substantially close enough together to create the floating body portion.

18. The memory cell of claim 16 wherein the vertical gate is coupled to a DRAM word line of a memory array and the control gate is coupled to a control gate word line of the memory array.

* * * * *

UNITED STATES PATENT AND TRADEMARK OFFICE
CERTIFICATE OF CORRECTION

PATENT NO.       : 7,457,159 B2                                          Page 1 of 1
APPLICATION NO.  : 11/368248
DATED            : November 25, 2008
INVENTOR(S)      : Bhattacharyya et al.

It is certified that error appears in the above-identified patent and that said Letters Patent is hereby corrected as shown below:

On the title page, item (56), under "Foreign Patent Documents", in column 2, line 1, after "A1" delete "*".

On the title page, item (56), under "Other Documents", in column 2, line 2, after "153-154." delete "*".

In column 8, line 9, in Claim 9, delete "though" and insert -- through --, therefor.

Signed and Sealed this

Third Day of March, 2009

JOHN DOLL
*Acting Director of the United States Patent and Trademark Office*